United States Patent
Yan

(10) Patent No.: US 12,495,664 B2
(45) Date of Patent: Dec. 9, 2025

(54) QUANTUM DOT LIGHT-EMITTING DIODE AND PREPARATION METHOD THEREFOR

(71) Applicant: TCL TECHNOLOGY GROUP CORPORATION, Huizhou (CN)

(72) Inventor: Yiran Yan, Huizhou (CN)

(73) Assignee: TCL TECHNOLOGY GROUP CORPORATION, Huizhou (CN)

( * ) Notice: Subject to any disclaimer, the term of this patent is extended or adjusted under 35 U.S.C. 154(b) by 389 days.

(21) Appl. No.: 18/259,976

(22) PCT Filed: Dec. 30, 2021

(86) PCT No.: PCT/CN2021/142995
§ 371 (c)(1),
(2) Date: Jun. 29, 2023

(87) PCT Pub. No.: WO2022/143882
PCT Pub. Date: Jul. 7, 2022

(65) Prior Publication Data
US 2024/0057364 A1  Feb. 15, 2024

(30) Foreign Application Priority Data
Dec. 31, 2020  (CN) .......................... 202011636178.7

(51) Int. Cl.
*H10K 50/115* (2023.01)
*H10K 50/15* (2023.01)
(Continued)

(52) U.S. Cl.
CPC ........... *H10K 50/115* (2023.02); *H10K 50/15* (2023.02); *H10K 50/171* (2023.02); *H10K 71/60* (2023.02);
(Continued)

(58) Field of Classification Search
CPC .. H10K 50/115; H10K 50/15; H10K 2101/30; H10K 2101/40
See application file for complete search history.

(56) References Cited

U.S. PATENT DOCUMENTS

| 2015/0028305 A1 | 1/2015 | Niu et al. |
| 2017/0069864 A1 | 3/2017 | Lee et al. |

(Continued)

FOREIGN PATENT DOCUMENTS

| CN | 106505151 A | 3/2017 |
| CN | 106784357 A | 5/2017 |

(Continued)

OTHER PUBLICATIONS

The World Intellectual Property Organization (WIPO) International Search Report for PCT/CN2021/142995 Mar. 9, 2022 5 Pages (including translation).

*Primary Examiner* — Alia Sabur
(74) *Attorney, Agent, or Firm* — ANOVA LAW GROUP, PLLC

(57) ABSTRACT

This disclosure involves a quantum dot light-emitting diode and its preparation method, the quantum dot light-emitting diode includes a quantum dot light-emitting layer set between a cathode and an anode, and a hole transport layer between the anode and the quantum dot light-emitting layer, an interface layer is set between the hole transport layer and the quantum dot light-emitting layer. An interface layer is set between the hole transport layer and the quantum dot light-emitting layer, a material of the interface layer is sulfide, a general structural formula of the sulfide is $Li_xB_yS_z$ where B is one or more of the Sn, P, Si, Ge; a HOMO energy level of the interface layer is greater than the HOMO energy level of the hole transport layer and less than that of the quantum dot light-emitting layer.

20 Claims, 2 Drawing Sheets

(51) Int. Cl.
  *H10K 50/17*     (2023.01)
  *H10K 71/60*     (2023.01)
  *H10K 85/00*     (2023.01)
  *H10K 101/40*    (2023.01)
  *H10K 102/00*    (2023.01)
  *H10K 102/10*    (2023.01)

(52) U.S. Cl.
  CPC ......... *H10K 85/00* (2023.02); *H10K 2101/40* (2023.02); *H10K 2102/102* (2023.02); *H10K 2102/103* (2023.02); *H10K 2102/351* (2023.02)

(56) References Cited

U.S. PATENT DOCUMENTS

| | | | |
|---|---|---|---|
| 2019/0097262 A1* | 3/2019 | Chen | H01M 10/056 |
| 2021/0296637 A1* | 9/2021 | Xie | H01M 4/386 |
| 2022/0098479 A1* | 3/2022 | Mei | C09K 11/55 |

FOREIGN PATENT DOCUMENTS

| | | | |
|---|---|---|---|
| CN | 106784400 A | 5/2017 | |
| CN | 107112429 A | 8/2017 | |
| CN | 109427986 A | 3/2019 | |
| CN | 110649167 A | 1/2020 | |
| CN | 111224001 A | 6/2020 | |
| CN | 111416051 A | 7/2020 | |
| CN | 111900258 A | 11/2020 | |
| CN | 112151689 A | 12/2020 | |
| EP | 3425690 A1 | 1/2019 | |

\* cited by examiner

QUANTUM DOT LIGHT-EMITTING DIODE AND PREPARATION METHOD THEREFOR

CROSS-REFERENCES TO RELATED APPLICATIONS

This application is a national stage application of PCT Patent Application No. PCT/CN2021/142995, filed on Dec. 30, 2021, which claims priority to Chinese Patent Application No. 202011636178.7, titled "Quantum dot light-emitting diode and preparation method therefor", filed on Dec. 31, 2020, the content of all of which is incorporated herein by reference.

FIELD OF THE DISCLOSURE

The present disclosure relates to the technical field of quantum dots, and in particular to a quantum dot light-emitting diode and its preparation method.

BACKGROUND

A quantum dot light-emitting diode (QLED) has good characteristics such as a high color purity, a narrow full width at half maximum with high light-emitting efficiency, an adjustable light-emitting color, and a stable devices etc, which makes the quantum dot light-emitting diode have broad application prospects in fields such as lighting. With the development of research, an external quantum efficiency (EQE) of the quantum dot light-emitting diode has improved significantly, among them, an external quantum efficiency of red light quantum dot light-emitting diode and that of a green quantum dot light-emitting diode are both higher than a level of 25%, and can be comparable to an external quantum efficiency organic light-emitting diode (OLED), but an external quantum efficiency of blue light quantum dot light-emitting diode and a lifespan of blue light quantum dot light-emitting diode are still not enough to meet the requirements.

Similar to OLED devices, the QLED device structure is usually composed of an anode, a hole injection layer, a hole transport layer, a quantum dot light-emitting layer, an electron transport layer, and a cathode. Electrons and holes are injected from the cathode and the anode respectively, and recombined to emit light in the quantum dot light-emitting layer. Existing electronic transport layers are usually composed of nano zinc oxide particles, which has a high charge carrier concentration and migration rate. A material used in the hole transport layer is an organic polymer material, such as PVK, TFB, etc. The low migration rate of the charge carrier and the excessive-deep energy level of the quantum dot in the hole transport layer leads to the difficulty of the hole injection, which makes holes accumulate in the hole transport layer or in an interface layer between the hole transport layer and quantum dot light-emitting layer. However, the excessive injection of electrons makes the electrons easily jump to the hole transport layer or an interface layer between the hole transport layer and the quantum dot light-emitting layer, leading to that the electrons and holes eventually are recombined at a non-light-emitting layer, which seriously affects the efficiency and the lifespan of the QLED device.

Therefore, the existing technology needs to be improved and developed.

BRIEF SUMMARY OF THE DISCLOSURE

According to the above described defects, the purpose of the present disclosure is to provide a quantum dot light-emitting diode and its preparation method, aiming to deal with the problem of low light-emitting efficiency of an existing quantum dot light-emitting diode.

The technical solution of this disclosure is as follows:

A quantum dot light-emitting diode, comprising a cathode, an anode, a quantum dot light-emitting layer set between the cathode and the anode, and a hole transport layer set between the anode and the quantum dot light-emitting layer, among them, an interface layer set between the hole transport layer and the quantum dot light-emitting layer, a material of the interface layer is sulfide, a general structural formula of the sulfide is $Li_xB_yS_z$, wherein B is one or more of Sn, P, Si and Ge, a HOMO energy level of the interface layer is greater than a HOMO energy level of the hole transport layer, and less than a HOMO energy level of the quantum dot light-emitting layer.

A preparation method for the quantum dot light-emitting diode, comprising steps: providing an anode substrate, setting a hole transport layer on the anode substrate, preparing an interface layer on the hole transport layer, a material of the interface layer is sulfide, a general structural formula of the sulfide is $Li_xB_yS_z$, wherein B is one or more of P, Si, Ge and Sn, preparing a quantum dot light-emitting layer on the interface layer, preparing a cathode on the quantum dot light-emitting layer, to prepare the quantum dot light-emitting diode, or, providing a cathode substrate to prepare a quantum dot light-emitting layer on the cathode substrate, preparing an interface layer on a surface of the quantum dot light-emitting layer, a material of the interface layer is sulfide, a general structural formula of the sulfide is $Li_xB_yS_z$, wherein B is one or more of the P, Si, Ge and Sn, preparing a hole transport layer on the interface layer, Preparing an anode on the hole transport layer to prepare the quantum dot light-emitting diode.

Benefits: in the present disclosure, this interface layer is set between the hole transport layer and the quantum dot light-emitting layer. As the HOMO energy level of the interface layer is located between the HOMO energy level of the hole transport layer and that of the quantum dot light-emitting layer, it can effectively reduce a hole injection barrier, thereby reducing the decay of materials and devices caused by the accumulation of holes at the barrier interface. The interface layer can also effectively block electron tunneling and avoid the recombination of electrons and holes in the non-quantum dot light-emitting layer, thus improving the light-emitting efficiency of the quantum dot light-emitting diode.

DETAILED DESCRIPTION OF EMBODIMENTS

Figure 1:
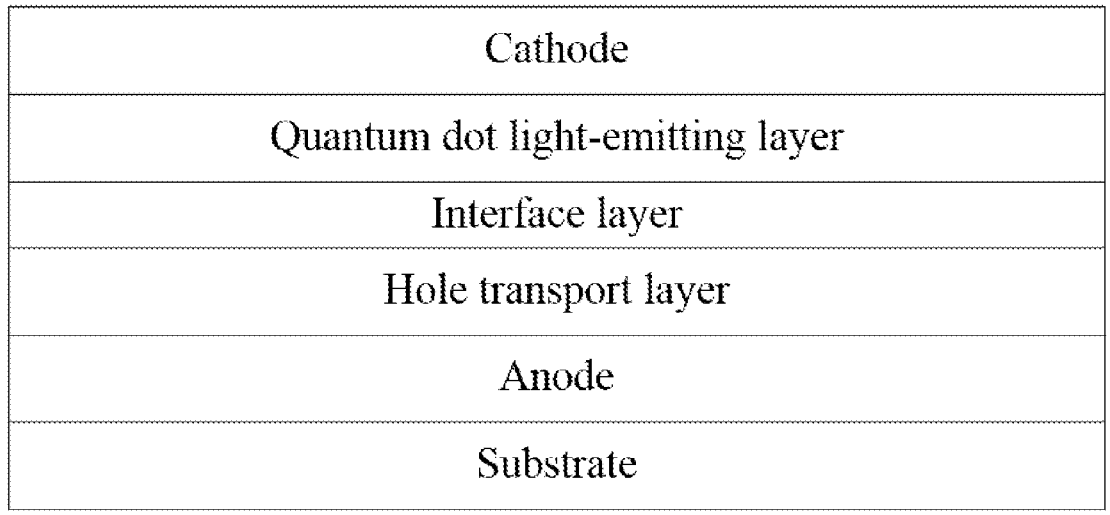
FIG. 1 shows a structural schematic diagram of an embodiment of a forward structure of a quantum dot light-emitting diode consistent with disclosed embodiments.

The present disclosure is providing a quantum dot light-emitting diode and its preparation methods. In order to make the purpose, technical solution and the advantages of the present disclosure clearer and more explicit, further detailed descriptions of the present disclosure are stated here, referencing to the attached drawings and some embodiments of the present disclosure. It should be understood that the detailed embodiments of the disclosure described here are used to explain the present disclosure only, instead of limiting the disclosure.

There are many forms of the quantum dot light-emitting diode, and the quantum dot light-emitting diode is divided into a forward structure and a reverse structure. The quantum dot light-emitting diode of the reverse structure may include a substrate, a cathode, a quantum dot light-emitting layer, a hole transport layer and an anode in layers from bottom to top. The embodiments of this disclosure is introduced based on the quantum diode light-emitting layer of the forward structure shown in FIG. 1. The quantum dot light-emitting diode of the forward structure includes the anode set on the surface of the substrate, the hole transport layer set on the anode surface, an interface layer on the surface of the hole transport layer, the quantum dot light-emitting layer set on the interface layer, the cathode set on the surface of the quantum dot light-emitting layer, among them, the material of the interface layer is sulfide, the general structural formula of the sulfide is $Li_xB_yS_z$, wherein B is one or more of the P, Si, Ge and Sn, the HOMO energy level of the interface layer is larger than the HOMO energy level of the hole transport layer, and less than that of the quantum dot light-emitting layer.

There is a large potential energy barrier between the highest occupied energy level (HOMO) commonly used in the hole transport layer and a work function of the quantum dot light-emitting layer, making it difficult to inject holes from the hole transport layer to the quantum dot light-emitting layer, resulting in unbalanced injection of holes and electrons, which seriously affects a lighting efficiency of the quantum light-emitting diode. In this embodiment, the interface layer prepared by sulfide is set between the hole transport layer and the quantum dot light-emitting layer. The HOMO energy level of the interface layer is larger than the HOMO energy level of the hole transport layer and less than that of the quantum dot light-emitting layer. The interface layer can effectively reduce a hole injection barrier, thereby reducing the decline of materials and devices caused by the accumulation of holes at the barrier interface, thus improving a light-emitting efficiency and a service life of the quantum dot light-emitting diode. The value of the HOMO energy level in this embodiment refers to the absolute value of the HOMO energy level. In other words, the HOMO energy level absolute value of the interface layer in this embodiment is greater than the HOMO energy level absolute value of the hole transport layer and less than that of the quantum dot light-emitting layer.

Furthermore, because a energy level barrier between the electronic transport materials and the quantum dot light-emitting layer is usually small, and the electronic injection is more likely to occur, which causes some electrons to easily tunnel to the hole transport layer or an interface between the hole transport layer and the quantum dot light-emitting layer, and to be recombined with holes in the non-quantum dot light-emitting layer region, thereby affecting the overall light-emitting efficiency of the quantum dot light-emitting diode. This embodiment sets an interface layer composed of sulfides between the hole transport layer and the quantum dot light-emitting layer. The material of the interface layer is sulfide, the general structural formula of the sulfide is $Li_xB_yS_z$, wherein B is one or more of P, Si, Ge and Sn. The sulfide has the property of conducting ions and holes, but not electrons. Therefore, the sulfide can not only effectively help the hole injection, but also effectively prevent electrons from tunneling to the hole transport layer, avoiding the device to emit light in the non-lighting-emitting area, thereby improving the overall lighting-emitting efficiency of the quantum dot light-emitting diode.

Furthermore, because the materials used in the hole transport layer of the quantum dot light-emitting diode are usually organic materials, such as PEDOT (polythiophene), such materials are more sensitive to water and oxygen. The gradual penetration of water and oxygen from the packaging glue can affect the stability of the injecting and transport of holes. The example of this embodiment can further effectively block water and oxygen infiltration by setting up the interface layer composed of sulfide between the hole transport layer and the quantum dot light-emitting layer, thereby improving the service life of the device.

In some embodiments, the thickness of the interface layer is 10-200 nm. Within this range, the interface layer can not only improve the injection rate of the holes and block the tunnel of electrons. If the thickness of the interface layer is less than 10 nm, the effect of blocking electrons tunnels to the hole transport layer is poor, if the thickness of the interface layer is greater than 200 nm, the injection distance of the hole is increased, which can affect the hole transport efficiency to the quantum dot light-emitting layer.

In some embodiments, the HOMO energy level of the interface layer is 4.9-6.0 eV. In this embodiment, because the HOMO energy level of the hole transport layer is usually 4.9-5.4 eV, and the HOMO energy level of the quantum dot light-emitting layer is usually 5.9-6.5 eV. At this time, the HOMO energy level of the interface layer is located between the hole transport layer and the quantum dot light-emitting layer can effectively reduce the hole injection barrier, thus improving the hole injection efficiency, thereby reducing the decline of materials and devices caused by the accumulation of holes at the interface of the energy level barrier, effectively improving the light-emitting efficiency of quantum dot light-emitting diode and the service life thereof. As an example, the TFB (HOMO energy level is 5.4 eV) is used as the hole transport layer, and when the Cds-ZnSe quantum dot is (HOMO energy level is 5.9-6.1 eV) as the quantum dot light-emitting layer material, this time the HOMO energy level of the interface layer can be 5.4-6 eV.

In some embodiments, the interface layer material is $Li_3PS_4$. In this embodiment, the HOMO energy level of the $Li_3PS_4$ is located between the HOMO energy level of the hole transport layer and the HOMO energy level of the quantum dot light-emitting layer. Therefore the interface layer can effectively reduce the hole injection barrier, thus improving the hole injection efficiency, thereby reducing the decline of materials and devices caused by the accumulation of holes at the interface of the energy level barrier, effectively improving the light-emitting efficiency of quantum dot light-emitting diode and the service life thereof.

In some embodiments, the material of the hole transport layer is selected from one or more of Poly(9,9-dioctylfluorene-co-N-(4-butylphenyl)diphenylamine) (TFB) and Poly(N-vinylcarbazole) (PVK), Poly[N,N'-bis(4-butylphenyl)-N,N'-bis(phenyl)-benzi)(Poly-TPD), Poly[[(4-butylphenyl)iMino]-1,4-phenylene[(4-butylphenyl)iMino]-1,4-phenylene(9,9-dioctyl-9H-fluorene-2,7-diyl)-1,4-phenylene](PFB), 4,4',4"-Tris(carbazol-9-yl)-triphenylamine (TCTA), 4,4'-Bis(N-carbazolyl)-1,1'-biphenyl (CBP), N,N'-Bis(3-methylphenyl)-N,N'-bis (phenyl)benzidine (TPD), N,N'-Bis-(1-naphthalenyl)-N,N'-bis-phenyl-(1,1'-biphenyl)-4,4'-diamine (NPB), but not limited to this.

In some embodiments, the quantum dot light-emitting layer is selected from one or more of a binary phase quantum dot, a ternary phase quantum dot, and a tetrad quantum dots, but it is not limited to that. As an example, the binary phase dots are at least one of CdS, CdSe, CdTe, InP, AgS, PbS, PbSe, HgS, and/or the ternary phase quantum dots are at least one of $Zn_xCd_{1-x}S$, $Cu_xIn_{1-x}S$, $Zn_xCd_{1-x}Se$, $Zn_xSe_{1-x}S$, $Zn_xCd_{1-x}Te$, $PbSe_xS_{1-x}$, and/or, the tetrad quantum dots phase is at least one of $Zn_xCd_{1-x}S/ZnSe$, $Cu_xIn_{1-x}S/ZnS$, $Zn_xCd_{1-x}Se/ZnS$, $CuInSeS$, $Zn_xCd_{1-x}Te/ZnS$, $PbSe_xS_{1-x}/ZnS$, of which $0<X<1$.

In some embodiments, a electron functional layer is set between the quantum dot light-emitting layer and the cathode, the electron functional layer includes a hole block layer, an electron injection layer and an electron transport layer, but it is not limited to that.

In some embodiments, a hole injection layer is further arranged between the anode and the hole transport layer.

In some embodiments, the hole injection layer is one or more of PEDOT: PSS, $WO_3$, $MoO_3$ and $V_2O_5$, but not limited to that.

In some embodiments, a thickness of the hole injection layer is 30-120 nm.

In some embodiments, the cathode may be Au, Ag, Al, Cu, MoX, or their alloys, but not limited to that.

In some embodiments, the thickness of the anode is 5-120 nm.

In some embodiments, the thickness of the hole transport layer is 30-120 nm.

In some embodiments, the thickness of the quantum dot light-emitting layer is 10-200 nm.

In some embodiments, the thickness of the electron transport layer is 5-100 nm, the thickness of the cathode is 5-120 nm.

In some embodiments, the anode is one or more of ITO, FTO, ATO, AZO, GZO, IZO, MZO, AMO, but not limited to that.

Figure 2:
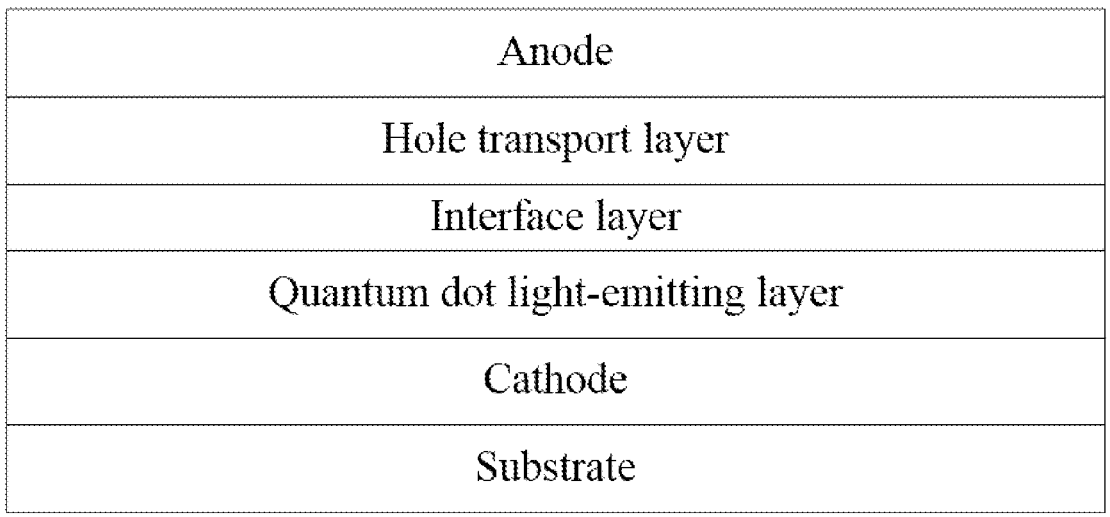
FIG. 2 shows a structural schematic diagram of an embodiment of a reverse structure of a quantum dot light-emitting diode consistent with the disclosed embodiments.

In some embodiments, this disclosure also provides a reverse structural quantum dot light-emitting diode, as shown in FIG. 2, the quantum dot light-emitting diode of the reverse structure includes the cathode set on the surface of the substrate, the quantum dot light-emitting layer set on the cathode surface, the interface layer set on the surface of the quantum dot light-emitting layer, the hole transport layer set on the surface of the interface layer, and the anode set on the surface of the hole transport layer. The interface layer material is sulfide, the general structural formula of the sulfide is $Li_xB_yS_z$, among them, B is P, Si, Ge and Sn. The HOMO energy level of the interface layer is larger than that of the hole transport layer and less than that of the quantum dot light-emitting layer.

In this embodiment, the interface layer made from sulfide is set between the hole transport layer and the quantum dot light-emitting layer. The HOMO energy level of the interface layer is larger than that of the hole transport layer and less than that of the quantum dot light-emitting layer, wherein the hole injection barrier is reduced to reduce the decline of the materials and devices caused by the accumulation of the holes at the interface of the energy barrier, thereby effectively improving the light-emitting efficiency and the service life of the quantum dot light-emitting diode. The interface layer material is sulfide, which is the general structural formula of the sulfide is $Li_xB_yS_z$, among them, B is one or more of the P, Si, Ge and Sn. The sulfide has the property of conducting ions and holes, but not electrons. The hole and ion conductivity of the sulfide at normal temperature is close to $10^{-2}$ S/cm, and the electronic conductivity of the sulfide is less than the ion/hole conductivity by more than 4-5 magnitudes. Therefore, the sulfide can not only effectively help the hole injection, but also effectively prevent electron from tunneling to the hole transport layer, avoiding the device to light up in the non-lighting-emitting area, thereby improving the overall lighting efficiency of the quantum dot light-emitting diode.

Figure 3:
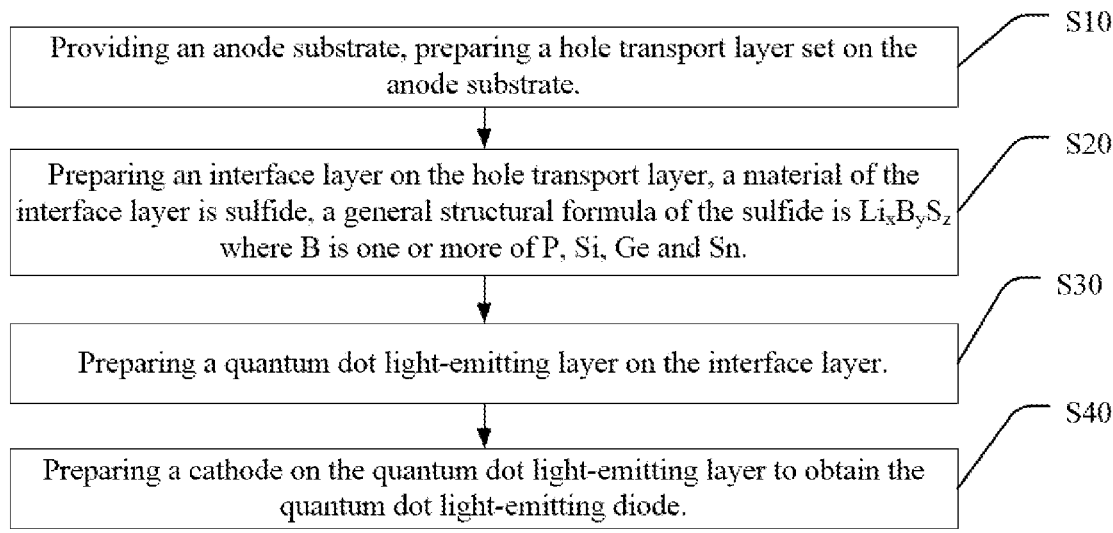
FIG. 3 is a flow chart of an embodiment of a preparation method for a forward structure quantum dot light-emitting diode consistent with the disclosed embodiments.

In some embodiments, a preparation method for a quantum dot lighting-emitting diode with a forward structure as shown in FIG. 1 is also provided. As shown in FIG. 3, it includes steps:

S10, providing an anode substrate, preparing a hole transport layer on the anode substrate.

S20, preparing an interface layer on the hole transport layer, a material of the interface layer is sulfide, a general structural formula of the sulfide is $Li_xB_yS_z$, wherein B is one or more of P, Si, Ge and Sn.

S30, preparing a quantum dot light-emitting layer in the interface layer.

S40, preparing a cathode on the quantum dot light-emitting layer to prepare the quantum dot light-emitting diode.

In this embodiment, a preparation method of the above layers may be a chemical method or a physical method, wherein the chemical method includes but is not limited to one or more of a chemical vapor deposition method, a continuous ion layer adsorption and reaction method, an anodic oxidation method, an electrolytic deposition method and a coprecipitation method; the physical method includes, but is not limited to, a physical coating method or a solution method, in which the solution method includes, but is not limited to, a spin-coating method, a printing method, a scraping method, a dip coating method, a soaking method, a spraying method, a roller coating method, a casting method, a slit coating method and a strip coating method, the physical coating method includes but is not limited to one or more of a thermal evaporation coating method, an electron beam evaporation coating method, a magnetron sputtering method, a multi-arc ion coating method, a physical vapor deposition method, an atomic layer deposition method and a pulsed laser deposition method.

In some embodiments, the spin-coating method is used to prepare the interface layer in the hole transport layer. It includes steps: dispersing the sulfide in an organic solvent to obtain a sulfide solution; spin-coating the sulfide solution on a surface of the hole transport layer, and obtaining the interface layer from a thermal annealing for 30 minutes under 100° C. In this embodiment, the organic solvent includes ethanol, methanol, butanol, acetone, isopropyl acetone, butyronitrile, chlorobenzene, toluene, xylene, dimethylformamide, dimethyl, sulfoxide, N-methylpyrrolidone and ethyl acetate, etc., but is not limited to these. In this embodiment, a concentration of the sulfide solution is 1-2 wt %, the prepared interface layer can not only reduce the interface barrier under the concentration range, but also effectively improve the light-emitting performance of the quantum dot light-emitting diode.

Figure 4:
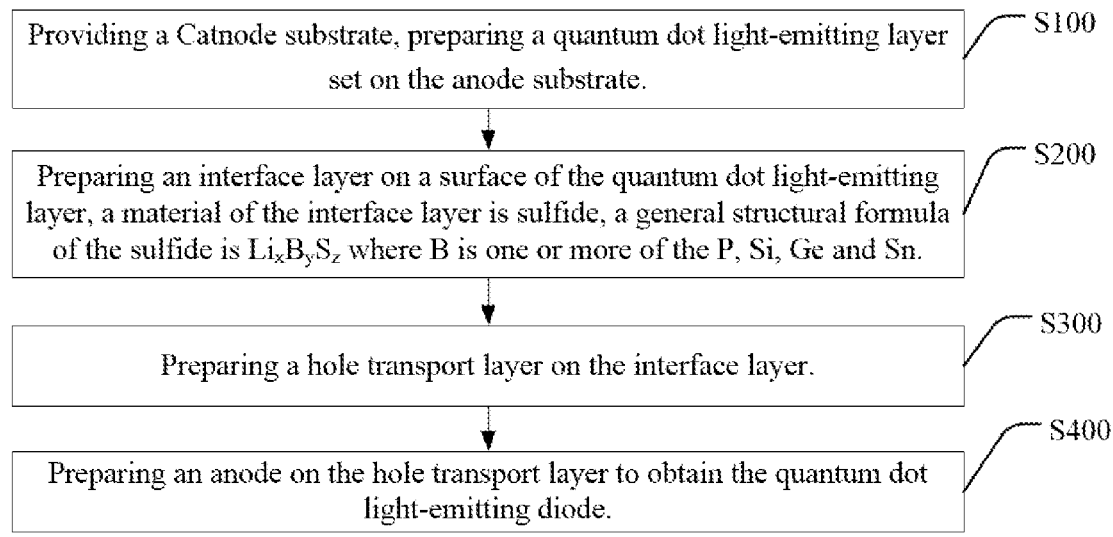
FIG. 4 is a flow chart of an embodiment of a preparation method for a reverse structure quantum dot light-emitting diode consistent with the disclosed embodiments.

In some embodiments, it is provided that a preparation method for the quantum dot light-emitting diode with a reverse structure, which includes steps below; the disclosure also provides a preparation method for the QLED with the negative structure shown in FIG. 2, as shown in FIG. 4, which includes steps:

S100, providing a cathode substrate to prepare a quantum dot light-emitting layer on the cathode substrate.

S200, preparing an interface layer surface of the quantum dot light-emitting layer, a material of the interface layer is a sulfide, a general structural formula of the sulfide is $Li_xB_yS_z$, wherein B is one or more of P, Si, Ge and Sn.

S300, preparing a hole transport layer on the interface layer.

S400, preparing an anode on the hole transport layer to prepare the quantum dot light-emitting diode.

In one embodiment of present disclosure, the cathode substrate comprises a substrate and a bottom electrode set on the substrate, wherein the bottom electrode is cathode. In another embodiment of present disclosure, the cathode substrate may comprise a substrate, a bottom electrode stacked on a surface of the substrate, and an electron injection layer stacked on the surface of the substrate. In another embodiment of present disclosure, the cathode substrate comprises a substrate, a bottom electrode stacked on a surface of the substrate, an electron injection layer stacked on the surface of the substrate, and an electron transport layer stacked on a surface of the electron injection layer. In another embodiment of present disclosure, the cathode substrate comprises a substrate, a bottom electrode stacked on a surface of the substrate, an electron injection layer stacked on the surface of the substrate, an electron transport layer stacked on a surface of the electron injection layer, and a hole block layer stacked on a surface of the electron transport layer.

In one embodiment, a preparation method for the above layers may be a chemical method or a physical method, wherein the chemical method includes but is not limited to one or more of a chemical vapor deposition method, a continuous ion layer adsorption and reaction method, an anodic oxidation method, an electrolytic deposition method and a coprecipitation method; the physical method includes, but is not limited to, a physical coating method or a solution method, in which the solution method includes, but is not limited to, a spin-coating method, a printing method, a scraping method, a dip coating method, a soaking method, a spraying method, a roller coating method, a casting method, a slit coating method and a strip coating method, the physical coating method includes but is not limited to one or more of a thermal evaporation coating method, an electron beam evaporation coating method, a magnetron sputtering method, a multi-arc ion coating method, a physical vapor deposition method, an atomic layer deposition method and a pulsed laser deposition method.

In some embodiments of the present disclosure, a further explanation of the quantum dot light-emitting diode and its preparation method is below:

The embodiment 1 of present disclosure provides a preparation method for the quantum dot light-emitting diode with a forward bottom emission structure, which includes the following steps:

Step S1: Depositing a hole injection layer on a transparent anode substrate, wherein the transparent anode is ITO, a material of the hole injection layer is $WO_3$, a thickness of the transparent anode is 20 nm, and a thickness of the hole injection layer is 60 nm.

Step S2: Depositing a hole transport layer on the hole injection layer, wherein a material of the hole transport layer is PFB, a thickness of the hole transport layer is 60 nm.

Step S3: Depositing an interface layer on the hole transport layer, wherein a material of the interface layer is $Li_3PS_4$, a thickness of the interface layer is 100 nm.

Step S4: Depositing a quantum dot light-emitting layer on the interface layer, wherein a material of the quantum dot light-emitting layer is PbSe, a thickness of the quantum dot light-emitting layer is 50 nm.

Step S5: Depositing a electron transport layer on the quantum dot light-emitting layer, wherein a material of the electron transport layer is TiO, a thickness of the electron transport layer is 60 nm.

Step S6: Depositing a metal cathode on the electron transport layer, wherein a material of the cathode is Ag, a thickness of the cathode is 100 nm, and a reflection of visible light on the cathode is not less than 98%.

The embodiment 2 of present disclosure provides a preparation method for the quantum dot light-emitting diode with a forward top emission structure, which includes the following steps:

Step S1: Depositing a hole injection layer on a transparent anode substrate, wherein the transparent anode is FTO, a material of the hole injection layer is $WO_3$, a thickness of the transparent anode is 20 nm, and a thickness of the hole injection layer is 60 nm.

Step S2: Depositing a hole transport layer on the hole injection layer, wherein a material of the hole transport layer is TCTA, a thickness of the hole transport layer is 60 nm.

Step S3: Depositing an interface layer on the hole transport layer, wherein a material of the interface layer is $Li_3PS_4$, a thickness of the interface layer is 100 nm.

Step S4: Depositing a quantum dot light-emitting layer on the interface layer, wherein a material of the quantum dot light-emitting layer is InP, a thickness of the quantum dot light-emitting layer is 50 nm.

Step S5: Depositing a electron transport layer on the quantum dot emissive layer, wherein the material of the electron transport layer is NiO, the thickness of the electron transport layer is 60 nm.

Step S6: Depositing a cathode on the electron transport layer, wherein the cathode material is Ag, the thickness of the cathode is 100 nm, and a transmission of the cathode on visible light is not less than 90%.

The embodiment 3 of present disclosure provides a preparation method for the quantum dot light-emitting diode with a reverse bottom emission structure, which includes the following steps:

Step S1: Depositing an Ag layer on a substrate by an evaporation method, wherein a thickness of the Ag layer is 5 nm.

Step S2: Depositing an electron transport layer on the Ag layer, wherein a material of the electron transport layer is SnO, a thickness of the electron transport layer is 50 nm.

Step S3: Depositing a quantum dot light-emitting layer on the electron transport layer, wherein a material of the quantum dot light-emitting layer is CdSe, a thickness of the quantum dot light-emitting layer is 50 nm.

Step S4: Depositing an interface layer on the quantum dot light-emitting layer, wherein a material of the interface layer is $Li_3PS_4$, a thickness of the interface layer is 80 nm.

Step S5: Depositing a hole transport layer on the interface layer, wherein a material of the hole transport layer is PVK, a thickness of the hole transport layer is 80 nm.

Step S6: Depositing a hole injection layer on the hole transport layer, wherein a material of the hole injection layer is PEDOT: PSS, a thickness of the hole transport layer is 60 nm.

Step S7: Depositing an anode on the hole injection layer, wherein a material of the anode is ITO, a thickness of the anode is 120 nm, and a reflection of visible light on the anode is not less than 98%.

The embodiment 4 of present disclosure provides a preparation method for the quantum dot light-emitting diode of a reverse top emission structure, which includes the following steps:

Step S1: Depositing an Ag layer on the substrate by an evaporation method, wherein a thickness of the Ag layer is 5 nm, Step S2: Depositing an electron transport layer on the Ag layer, wherein a material of the electron transport layer is TiO, a thickness of the electron transport layer is 60 nm, Step S3: Depositing a quantum dot light-emitting layer on the electron transport layer, wherein a material of the quantum dot light-emitting layer is CdTe, a thickness of the quantum dot light-emitting layer is 50 nm, Step S4: Depositing an interface layer on the quantum dot light-emitting layer, wherein a material of the interface layer is $Li_3PS_4$, a thickness of the interface layer is 80 nm, Step S5: Depositing a hole transport layer on the interface layer, wherein a material of the hole transport layer is PFB, a thickness of the hole transport layer is 80 nm, Step S6: Depositing a hole injection layer on the hole transport layer, wherein a material of the hole injection layer is $MoO_3$, a thickness of the hole transport layer is 60 nm, Step S7: Depositing an anode on the hole injection layer, wherein a material of the anode is ITO, a thickness of the cathode is 120 nm, and a transmission of visible light on the cathode is not less than 90%.

The comparative example 1 of present disclosure provides a preparation method for the quantum dot light-emitting diode of a forward bottom emission structure, which includes the following steps:

Step S1: Depositing a hole injection layer on a transparent anode substrate, wherein the transparent anode is ITO, a material of the hole injection layer is $WO_3$, a thickness of the transparent anode is 20 nm, and a thickness of the hole injection layer is 60 nm.

Step S2: Depositing a hole transport layer on the hole injection layer, wherein a material of the hole transport layer is PFB, a thickness of the hole transport layer is 60 nm.

Step S3: Depositing a quantum dot light-emitting layer on the hole transport layer, wherein a material of the quantum dot light-emitting layer is PbSe, a thickness of the quantum dot light-emitting layer is 50 nm.

Step S4: Depositing an electron transport layer on the quantum dot light-emitting layer, wherein a material of the electron transport layer is TiO, a thickness of the electron transport layer is 60 nm.

Step S5: Depositing a metal cathode on the electron transport layer, wherein a material of the cathode is Ag, a thickness of the cathode is 100 nm, and a reflection of visible light on the cathode is not less than 98%.

The comparative example 2 of present disclosure provides a preparation method for the quantum dot light-emitting diode of a forward top emission structure, which includes the following steps:

Step S1: Depositing a hole injection layer on a transparent anode substrate, wherein the transparent anode is FTO, a material of the hole injection layer is $WO_3$, a thickness of the transparent anode is 20 nm, and a thickness of the hole injection layer is 60 nm.

Step S2: Depositing a hole transport layer on the hole injection layer, wherein a material of the hole transport layer is TCTA, a thickness of the hole transport layer is 60 nm.

Step S3: Depositing a quantum dot light-emitting layer on the hole transport layer, wherein a material of the quantum dot light-emitting layer is InP, a thickness of the quantum dot light-emitting layer is 50 nm.

Step S4: Depositing an electron transport layer on the quantum dot light-emitting layer, wherein a material of the electron transport layer is NiO, a thickness of the electron transport layer is 60 nm.

Step S5: Depositing a cathode on the electron transport layer, wherein a material of the cathode is Ag, a thickness of the cathode is 100 nm, and a transmission of visible light on the cathode is not less than 90%.

The comparative example 3 of present disclosure provides a preparation method for the quantum dot light-emitting diode of a reverse bottom emission structure, which includes the following steps:

Step S1: Depositing an Ag layer on a substrate by an evaporation method, wherein a thickness of the Ag layer is 5 nm.

Step S2: Depositing an electron transport layer on the Ag layer, wherein a material of the electron transport layer is SnO, a thickness of the electron transport layer is 50 nm.

Step S3: Depositing a quantum dot light-emitting layer on the electron transport layer, wherein a material of the quantum dot light-emitting layer is CdSe, a thickness of the quantum dot light-emitting layer is 50 nm.

Step S4: Depositing a hole transport layer on the quantum dot light-emitting layer, wherein a material of the hole transport layer is PVK, a thickness of the hole transport layer is 80 nm.

Step S5: Depositing a hole injection layer on the hole transport layer, wherein a material of the hole injection layer is PEDOT: PSS, a thickness of the hole transport layer is 60 nm.

Step S6: Depositing an anode on the hole injection layer, wherein a material of the anode is ITO, a thickness of the anode is 120 nm, and a reflection of visible light on the anode is not less than 98%.

The comparative example 4 of present disclosure provides a preparation method for the quantum dot light-emitting diode of a reverse top emission structure, which includes the following steps:

Step S1: Depositing an Ag layer on a substrate by an evaporation method, wherein a thickness of the Ag layer is 5 nm.

Step S2: Depositing an electron transport layer on the Ag layer, wherein a material of the electron transport layer is TiO, a thickness of the electron transport layer is 60 nm.

Step S3: Depositing a quantum dot light-emitting layer on the electron transport layer, wherein a material of the quantum dot light-emitting layer is CdTe, a thickness of the quantum dot light-emitting layer is 50 nm.

Step S4: Depositing a hole transport layer on the quantum dot light-emitting layer, wherein a material of the hole transport layer is PFB, a thickness of the hole transport layer is 80 nm.

Step S5: Depositing a hole injection layer on the hole transport layer, wherein a material of the hole injection layer is $MoO_3$, a thickness of the hole transport layer is 60 nm.

Step S6: Depositing an anode on the hole injection layer, wherein a material of the anode is ITO, a thickness of the anode is 120 nm, and a transmission of visible light on the anode on is not less than 90%.

The properties of quantum dot light-emitting diodes prepared in embodiment 1-4 and comparative examples 1-4 are tested, and the results obtained are shown in Table 1:

TABLE 1

The property test results of the quantum dot light-emitting diode

| | External quantum efficiency-EQE (%) | LT95 (h) |
|---|---|---|
| Embodiment 1 | 10.2 | 6.3 |
| Embodiment 2 | 16.3 | 5.0 |
| Embodiment 3 | 9.4 | 6.8 |
| Embodiment 4 | 16.9 | 5.8 |
| Comparative example 1 | 7.9 | 5.4 |
| Comparative example 2 | 14.6 | 3.9 |
| Comparative example 3 | 8.3 | 5.9 |
| Comparative example 4 | 15.8 | 4.1 |

From datas in Table 1, the difference between the Embodiment 1 and the Comparative example 1 is that the interface layer formed by the $Li_3PS_4$ material is added between the hole transport layer and the quantum dot light-emitting layer, the external quantum efficiency is increased from 7.9% to 10.2%, the service life is increased from 5.4 h to 6.3 h; the difference between the Embodiment 2 and the Comparative example 2 is that the interface layer formed by the $Li_3PS_4$ material is added between the hole transport layer and the quantum dot light-emitting layer, the external quantum efficiency is increased from 14.6% to 16.3%, and the service life is increased from 3.9 h to 5.0 h; the difference between the Embodiment 3 and the Comparative example 3 is that the interface layer formed by the $Li_3PS_4$ material is added between the hole transport layer and the quantum dot light-emitting layer, the external quantum efficiency is increased from 8.3% to 9.4%, and the service life is increased from 5.9 h to 6.8 h; the difference between the Embodiment 4 and the Comparative example 4 is that the interface layer formed by the $Li_3PS_4$ material is added between the hole transport layer and the quantum dot light-emitting layer, the external quantum efficiency is increased from 15.8% to 16.9%, and the service life is increased from 4.1 h to 5.8 h. Through the above datas, it can be found that the interface layer between the hole transport layer and the quantum dot light-emitting layer can effectively improve the external quantum efficiency and service life.

In summary, the present disclosure optimizes the quantum dot light-emitting diode device. The interface layer is set between the hole transport layer and the quantum dot light-emitting layer, thereby reducing the hole injection barrier, improving the hole injection, and avoiding the accumulation of holes at the interface, and effectively reducing the recombination of electrons tunneling to the hole transport layer in the non-quantum dot light-emitting region, improving the efficiency and life of the device. The interface layer can also effectively block the influence of water and oxygen on the organic hole injection and transport layer, thus improving the stability of the device.

It should be understood that, the embodiments described above are not limiting applications of the present disclosure. For those ordinary skilled in this art, modifications and variations can be made according to the above descriptions. All these modifications and variations are intended to be included herein within the scope of the appended claims of the present disclosure.

What is claimed is:

1. A quantum dot light-emitting diode, wherein comprising, a cathode, an anode, a quantum dot light-emitting layer set between the cathode and the anode, and a hole transport layer set between the anode and the quantum dot light-emitting layer, an interface layer set between the hole transport layer and the quantum dot light-emitting layer, wherein a material of the interface layer is sulfide, a general structural formula of the sulfide is $Li_xB_yS_z$ where B is one or more of Sn, P, Si, Ge, a HOMO energy level of the interface layer is greater than a HOMO energy level of the hole transport layer and less than a HOMO energy level of the quantum dot light-emitting layer.

2. The quantum dot light-emitting diode according to claim 1, wherein a thickness of the interface layer is 10-200 nm.

3. The quantum dot light-emitting diode according to claim 1, wherein the HOMO energy level of the interface layer is 5.4-6.0 eV.

4. The quantum dot light-emitting diode according to claim 1, wherein the material of the interface layer is $Li_3PS_4$.

5. The quantum dot light-emitting diode according to claim 1, wherein a material of the hole transport layer is one or more of TFB, PVK, Poly-TPD, PFB, TCTA, CBP, TPD and NPB.

6. The quantum dot light-emitting diode according to claim 5, wherein a material of the hole transport layer is TFB.

7. The quantum dot light-emitting diode according to claim 1, wherein a material of the quantum dot light-emitting layer is one or more of a binary phase quantum dot, a ternary phase quantum dot and a tetrad quantum dot point.

8. The quantum dot light-emitting diode according to claim 7, wherein the binary phase quantum dot is at least one of CdS, CdSe, CdTe, InP, AgS, PbS, PbSe, HgS, and/or the ternary phase quantum dot is at least one of $Zn_XCd_{1-X}S$, $Cu_XIn_{1-X}S$, $Zn_XCd_{1-X}Se$, $Zn_XSe_{1-X}S$, $Zn_XCd_{1-X}Te$, $PbSe_XS_{1-X}$, and/or, the tetrad phase quantum dot is at least one of $Zn_XCd_{1-X}S/ZnSe$, $Cu_XIn_{1-X}S/ZnS$, $Zn_XCd_{1-X}Se/ZnS$, CuInSeS, $Zn_XCd_{1-X}Te/ZnS$, $PbSe_XS_{1-X}/ZnS$, of which 0<X<1.

9. The quantum dot light-emitting diode according to the claim 1, wherein an electron functional layer is set between the quantum dot light-emitting layer and the cathode, and/or a hole injection layer is set between the anode and the hole transport layer.

10. The quantum dot light-emitting diode according to the claim 9, wherein the electron functional layer includes a hole block layer, an electron injection layer and an electron transport layer.

11. The quantum dot light-emitting diode according to claim 9, wherein the hole injection layer is one or more of PEDOT: PSS, $WO_3$, $MoO_3$ and $V_2O_5$.

12. The quantum dot light-emitting diode according to claim 1, wherein a thickness of the anode is 5-120 nm, and/or, a thickness of the cathode is 5-120 nm, and/or, a thickness of the quantum dot light-emitting layer is 10-200 nm, and/or, a thickness of the hole transport layer is 30-120 nm.

13. The quantum dot light-emitting diode according to claim 1, wherein the cathode is one or more of Au, Ag, Al, Cu, Mo.

14. The quantum dot light-emitting diode according to claim 1, wherein the anode is one or more of ITO, FTO, ATO, AZO, GZO, IZO, MZO, AMO.

15. A preparation method for a quantum dot light-emitting diode, wherein comprising steps:
- providing an anode substrate, preparing a hole transport layer on the anode substrate, preparing an interface layer on the hole transport layer, a material of the interface layer is sulfide, a general structural formula of the sulfide is $Li_xB_yS_z$ where B is one or more of P, Si, Ge and Sn,
- preparing a quantum dot light-emitting layer on the interface layer,
- preparing a cathode on the quantum dot light-emitting layer to obtain the quantum dot light-emitting diode;
- or, providing a cathode substrate, preparing a quantum dot light-emitting layer on the cathode substrate,
- preparing an interface layer on a surface of the quantum dot light-emitting layer, a material of the interface layer is sulfide, a general structural formula of the sulfide is $Li_xB_yS_z$ where B is one or more of the P, Si, Ge and Sn,
- preparing a hole transport layer on the interface layer,
- preparing an anode on the hole transport layer to obtain the quantum dot light-emitting diode.

16. The preparation method for the quantum dot light-emitting diode according to claim 15, wherein steps of the preparing the hole transport layer on the interface layer include:
- dispersing the sulfide in an organic solvent to obtain a sulfide solution,
- preparing the interface layer on the surface the hole transport layer, the material of the interface layer is the sulfide;
- or, steps of the preparing the interface layer on the surface of the quantum dot light-emitting layer include:
- dispersing the sulfide in an organic solvent to obtain the sulfide solution,
- preparing the interface layer on the surface of the quantum dot light-emitting layer, the material of the interface layer is the sulfide.

17. The preparation method for the quantum dot light-emitting diode according to claim 16, wherein a concentration of the sulfide solution is 1-2 wt %.

18. The preparation method for the quantum dot light-emitting diode according to claim 15, wherein a material of the hole transport layer is one or more of TFB, PVK, Poly-TPD, PFB, TCTA, CBP, TPD and NPB.

19. The preparation method for the quantum dot light-emitting diode according to claim 15, wherein a thickness of the anode or the anode substrate is 5-120 nm, and/or, a thickness of the cathode or cathode substrate is 5-120 nm, and/or, a thickness of the quantum dot light-emitting layer is 10-200 nm, and/or, a thickness of the hole transport layer is 30-120 nm.

20. The preparation method for the quantum dot light-emitting diode according to claim 15, wherein the cathode is one or more of Au, Ag, Al, Cu, Mo, and the anode is one or more of ITO, FTO, ATO, AZO, GZO, IZO, MZO, AMO.

* * * * *